United States Patent
Borkar

(10) Patent No.: US 7,167,015 B2
(45) Date of Patent: Jan. 23, 2007

(54) ACTIVE COOLING TO REDUCE LEAKAGE POWER

(75) Inventor: Shekhar Y. Borkar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/972,838

(22) Filed: Oct. 22, 2004

(65) Prior Publication Data

US 2005/0052196 A1    Mar. 10, 2005

Related U.S. Application Data

(62) Division of application No. 10/000,729, filed on Oct. 31, 2001, now Pat. No. 6,809,538.

(51) Int. Cl.
*G01R 31/26* (2006.01)
*G01R 31/02* (2006.01)

(52) U.S. Cl. .................... 324/760; 324/765; 324/158.1

(58) Field of Classification Search ............ 324/158.1, 324/760–765; 165/80.3; 219/209; 702/130–132; 713/322, 300, 340; 323/282
See application file for complete search history.

(56) References Cited

U.S. PATENT DOCUMENTS

| | | | | |
|---|---|---|---|---|
| 4,330,809 | A | 5/1982 | Stanley | 361/103 |
| 5,287,292 | A * | 2/1994 | Kenny et al. | 702/132 |
| 5,324,916 | A * | 6/1994 | Goto et al. | 219/497 |
| 5,557,551 | A | 9/1996 | Craft | 702/130 |
| 5,719,800 | A * | 2/1998 | Mittal et al. | 713/321 |
| 5,873,053 | A | 2/1999 | Pricer et al. | 702/130 |
| 6,476,627 | B1 | 11/2002 | Pelissier et al. | 713/322 |
| 6,489,793 | B1 | 12/2002 | Jones et al. | 324/760 |
| 6,513,124 | B1 | 1/2003 | Furuichi et al. | 713/322 |

* cited by examiner

*Primary Examiner*—Vinh P. Nguyen
(74) *Attorney, Agent, or Firm*—Schwegman, Lundberg, Woessner & Kluth, P.A.

(57) ABSTRACT

Leakage power consumed by an integrated circuit is estimated as the difference between total power consumption and a nominal expected power consumption. Leakage power is reduced by cooling the integrated circuit in an active cooling system. By expending power in the active cooling system, the integrated circuit is cooled and the total power consumption is decreased. When the decrease in total power consumption is greater than the power expended in the cooling system, an overall power savings is achieved.

7 Claims, 6 Drawing Sheets

ACTIVE COOLING TO REDUCE LEAKAGE POWER

RELATED APPLICATION

This application is a Divisional of U.S. application Ser. No. 10/000,729 filed Oct. 31, 2001 now U.S. Pat. No. 6,809,538 which is incorporated herein by reference.

FIELD

The present invention relates generally to integrated circuits, and more specifically to the reduction of leakage power in integrated circuits.

BACKGROUND OF THE INVENTION

Transistors within integrated circuits are becoming smaller. Each new generation of integrated circuits includes an ever increasing number of these smaller transistors. As transistors become smaller, the "leakage current" through the transistors becomes larger.

Leakage current is current that conducts through a transistor even when the transistor is supposed to be off. In most circuit configurations, leakage current is undesirable because it consumes power without producing useful work. Modern integrated circuits are experiencing larger leakage currents as a percentage of total current consumption because of the greater number of transistors, with each transistor having a larger leakage current.

Circuit techniques have been devised in attempts to reduce leakage currents. FIGS. 1A and 1B show the addition of a "sleep transistor" designed to reduce leakage current. FIG. 1A shows leakage current flowing from power supply node 102, through the transistors within circuit block 104 to reference node 106. FIG. 1A represents a circuit with large leakage currents. FIG. 1B shows sleep transistor 110 in series with the leakage current path. The sleep transistor is typically a transistor with a large threshold voltage. Turning off sleep transistor 110 when circuit block 104 is not active reduces the leakage current.

Circuit techniques can be effective to reduce leakage current, but typically require additional area on the integrated circuit die. For example, as shown in FIG. 1B, sleep transistor 110 is an addition to the circuit. For large integrated circuits, many such sleep transistors can be added resulting in considerable additional consumption of integrated circuit die area.

For the reasons stated above, and for other reasons stated below which will become apparent to those skilled in the art upon reading and understanding the present specification, there is a need in the art for an alternate method and apparatus to reduce leakage current in integrated circuits.

DESCRIPTION OF EMBODIMENTS

Figure 1A:
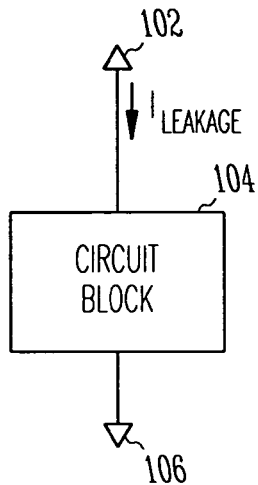
FIGS. 1A and 1B show prior art circuits.
Figure 1B:
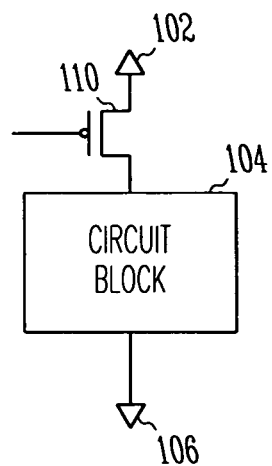

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to reduce leakage power in an integrated circuit by cooling the integrated circuit. Methods and apparatus are provided to measure total power in the integrated circuit and conditionally apply power to a cooling system to cool the integrated circuit. In some embodiments, decisions to cool the integrated circuit are made solely as a function of the total power consumption. In other embodiments, leakage power consumption is estimated as a difference between total power consumption and a nominal expected power, and the decision to cool the integrated circuit is a function of the estimated leakage power.

Figure 2:
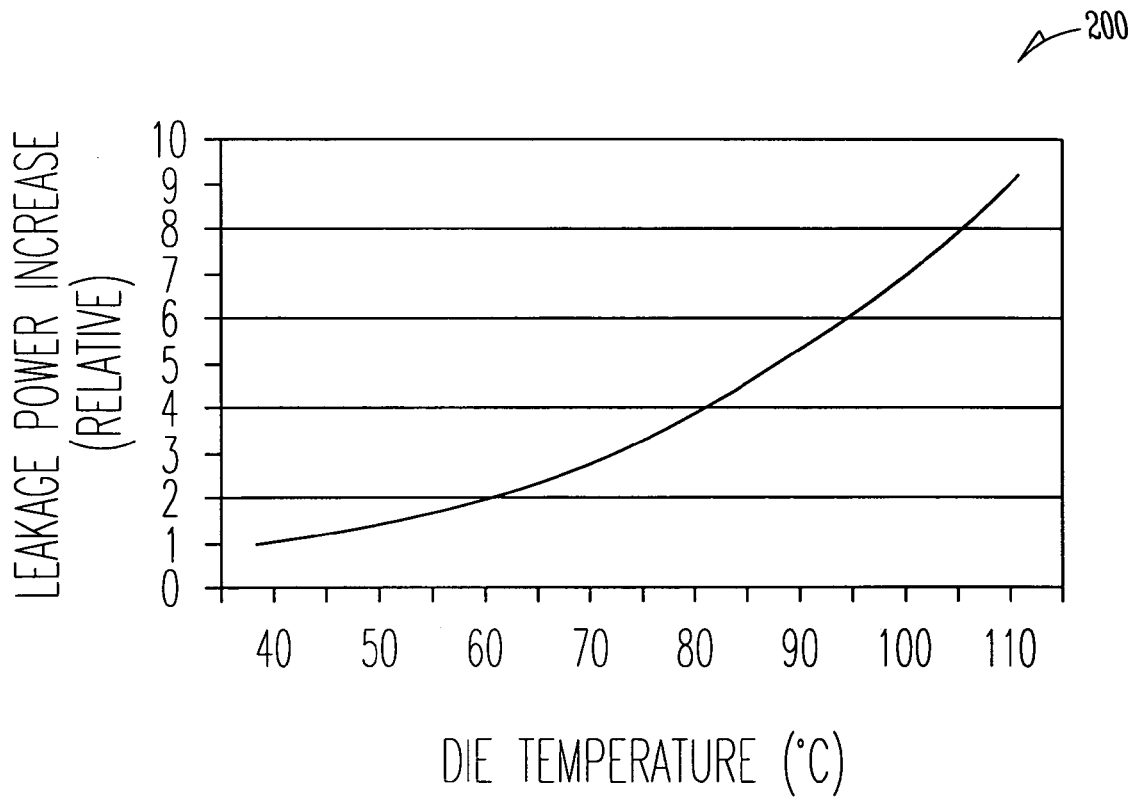
FIG. 2 shows a graph of relative leakage power versus temperature.

FIG. 2 shows a graph of relative leakage power versus temperature. Graph 200 illustrates how leakage power in an integrated circuit increases exponentially as a function of temperature. For example, the increase in leakage power due to a die temperature rising from 60 degrees C. to 80 degrees C. is smaller than the increase in leakage power when the die temperature rises from 80 degrees C. to 100 degrees C.

As can be seen from FIG. 2, elevated die temperatures contribute heavily to increased leakage power consumption in integrated circuits.

Figure 3:
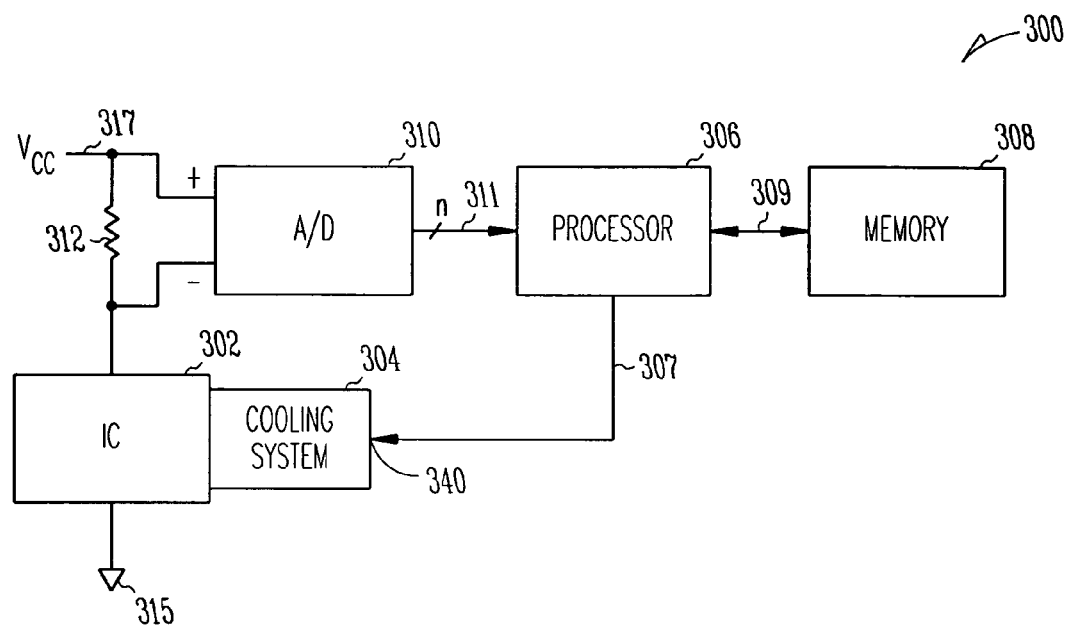
FIG. 3 shows a system to reduce leakage power consumption in an integrated circuit.

FIG. 3 shows a system to reduce leakage power consumption in an integrated circuit. System 300 includes integrated circuit (IC) 302, integrated circuit cooling system 304, processor 306, memory 308, analog-to-digital converter (A/D) 310, and resistor 312. IC 302 is an integrated circuit with many small geometry transistors that consume leakage current (and therefore leakage power). Integrated circuit cooling system 304 provides cooling to IC 302 to reduce leakage power. Integrated circuit cooling system includes a control input node 340 coupled to node 307, which provides control information from processor 306.

Resistor 312 and A/D 310 form a power measuring device. The output of A/D 310 represents the total current consumed, which is proportional to power. Any type of power measuring device can be used without departing from the scope of the present invention. In addition, resistor 312, A/D 310, processor 306, and memory 308 form a feedback loop that measures total power consumption by IC 302, and directs cooling of IC 302 by integrated circuit cooling system 304. In some embodiments, the feedback loop measures instantaneous power consumption and directs cooling as a function of the instantaneous power consumption. In other embodiments, processor 306 computes the total energy consumed over a period of time and directs cooling as a function of the total energy consumption. This can be useful to reduce energy consumption due to leakage, and to increase battery life of portable products.

In operation, IC 302 consumes current that conducts from power supply node 317 (Vcc) to reference node 315. This current passes through resistor 312. The current passing through resistor 312 generates a voltage which is input to A/D 310. A/D 310 digitizes the voltage and generates a digital word on node 311 that represents the current, and therefore the power, consumed by IC 302. Processor 306 reads the digital word that represents the power consumption by the integrated circuit, and then conditionally commands cooling system 304 to expend power to cool IC 302. As shown in FIG. 2, cooling the integrated circuit reduces leakage power. If the amount of leakage power savings as a result of cooling IC 302 exceeds the amount of power expended in integrated circuit cooling system 304, then the operation of system 300 results in an overall power savings.

A/D 310 is shown driving "n" physical data lines represented by node 311. One skilled in the art will appreciate that any number of data lines can be output from A/D 310 without departing from the scope of the present invention.

Processor 306 can be any type of processor capable of communicating with memory 308, A/D 310, and integrated circuit cooling system 304. Examples include, but are not limited to, a microprocessor, a digital signal processor, a graphics controller, and a microcontroller. Memory 308 can be any type of article having a computer readable medium, such as a floppy disk, a hard disk, a random access memory (RAM), a read only memory (ROM), or a compact disc ROM (CD-ROM). In some embodiments, processor 306 reads instructions from memory 308 to perform methods of the present invention. For example, processor 306 can read instructions from memory 308 to determine how much power to expend in cooling system 304. Various method embodiments of the present invention are discussed in more detail below.

System 300 is shown having separate nodes 311, 309, and 307 used for communication between processor 306 and A/D 310, memory 308, and cooling system 304, respectively. In some embodiments, processor 306 includes an input port dedicated to the reception of information from A/D 310, and an output port dedicated to communication with cooling system 304. In other embodiments, A/D 310, cooling system 304, and memory 308 are memory-mapped peripherals, and nodes 311, 309, and 307 are schematic representations of a common bus.

Cooling system 304 is an "active" cooling system that cools IC 302 when power is applied thereto. For example, a heat sink and fan in combination form an active cooling system, whereas a heat sink alone is passive. Other types of active cooling systems are used in various embodiments of the present invention. Some embodiments use thermoelectric cooling devices such as coolers that employ the Peltier-effect, where current flowing through dissimilar metals creates a temperature differential across the metallic junction. Other embodiments use vapor phase cooling devices such as refrigeration devices or heat pumps. The method and apparatus of the present invention are not limited by the type of active cooling system employed: any type of active cooling system can be employed without departing from the scope of the present invention.

In some embodiments, power consumption by IC 302 under various conditions is characterized during manufacture, test, or when system 300 is built or tested. This characterization results in information describing nominal expected power consumption under different conditions, and this information can be advantageously utilized by processor 306 during operation of system 300. For example, when processor 306 has access to nominal expected power consumption data for IC 302, processor 306 can determine the amount of power being expended beyond the nominal expected power consumption. The characterization can be performed as a function of any variable. For example, expected power can be determined as a function of die temperature, operating speed, data load, or other operating condition. Processor 306 can utilize all of this information in determining whether to activate cooling system 304 to reduce leakage power.

Figure 4:
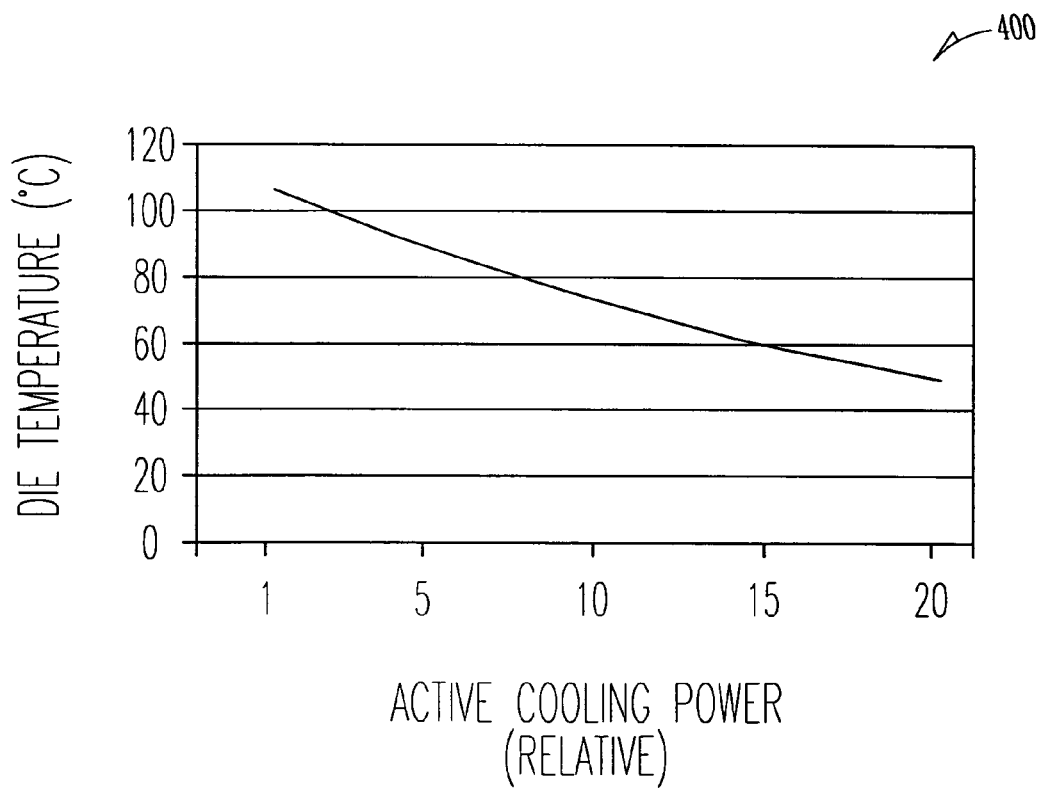
FIG. 4 shows a graph of die temperature as a function of relative active cooling power.

FIG. 4 shows a graph of die temperature as a function of relative active cooling power. The active cooling power referred to in graph 400 represents the power expended in an active cooling system such as integrated circuit cooling system 304 (FIG. 3). The die temperature in graph 400 represents the temperature of the integrated circuit die being cooled. Graph 400, like graph 200 (FIG. 2), is not linear. Graph 400 shows that a greater incremental decrease in die temperature can be achieved at a lower relative cooling power. For example, as shown in FIG. 4, it takes approximately 1.5 times as much active cooling power to cool the die 20 degrees from 80 degrees C. to 60 degrees C. than to cool the die 20 degrees from 100 degrees C. to 80 degrees C.

The active cooling power in graph 400 is shown as relative because the actual power needed to cool an integrated circuit die is a function of the integrated circuit. For example, for large integrated circuits with many small geometry transistors, each unit of relative active cooling power in graph 400 may represent many watts of power. In contrast, for very small integrated circuits, each unit of relative active cooling power may represent a fraction of one watt of power.

The combination of graphs 400 and 200 (FIG. 2) show that relatively small relative increases in active cooling power can produce pronounced reductions in relative leakage power. Referring now back to FIG. 3, processor 306 can take advantage of this phenomenon by increasing the active cooling power expended in integrated circuit cooling system 304. When the active cooling power expended in the cooling system is less than the leakage power saved in the integrated circuit, an overall power savings is achieved.

Figure 5:
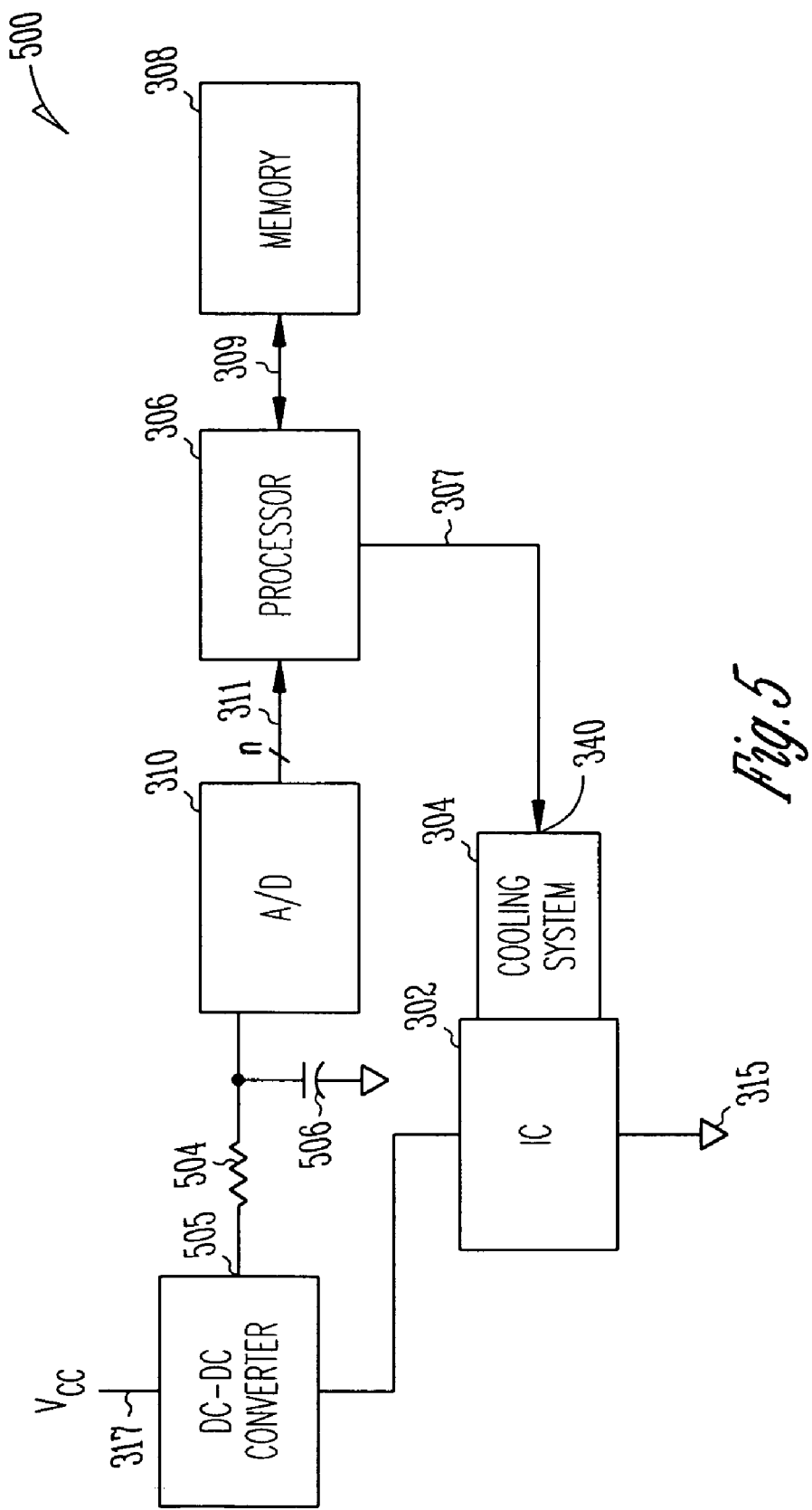
FIG. 5 shows another system to reduce leakage power consumption in an integrated circuit.

FIG. 5 shows another system to reduce leakage power consumption in an integrated circuit. System 500, like system 300 (FIG. 3), includes A/D 310, processor 306, memory 308, IC 302, and cooling system 304. In contrast to system 300, system 500 includes DC-DC converter 502, resistor 504, and capacitor 506. DC-DC (Direct Current—Direct Current) converter 502 converts a DC power supply voltage on node 317 (Vcc) to a different power supply voltage on node 503 to supply IC 302. DC-DC 502 converter also outputs a signal on node 505.

The signal on node 505 gives an indication of current output, or "current draw," from DC-DC converter 502 on node 503. In some embodiments, the signal on node 505 is a sawtooth waveform that is a result of a switching element within DC-DC converter 502. In other embodiments, the signal on node 505 is a pulse code modulated (PCM) signal that has a duty cycle that is proportional to current output on node 503. In general, any signal format that gives an indication of current output on node 503 can be utilized without departing from the scope of the present invention.

Resistor 504 and capacitor 506 form a low-pass filter that converts the signal on node 505 to a form suitable for input to A/D 310. A/D 310 digitizes the voltage value output from the low-pass filter, and the remaining portions of system 500 function in a similar fashion to system 300 (FIG. 3). Processor 306 receives from A/D 310 an indication of total power consumed in IC 302 and, as a function of total power consumption alone or total power consumption combined with nominal expected power consumption, commands cooling system 304 to expend power to cool IC 302. In some embodiments, total energy consumption is computed from the total power consumption over time, and processor 306 commands cooling system 304 to expend power as a function of the total energy consumption.

Figure 6:
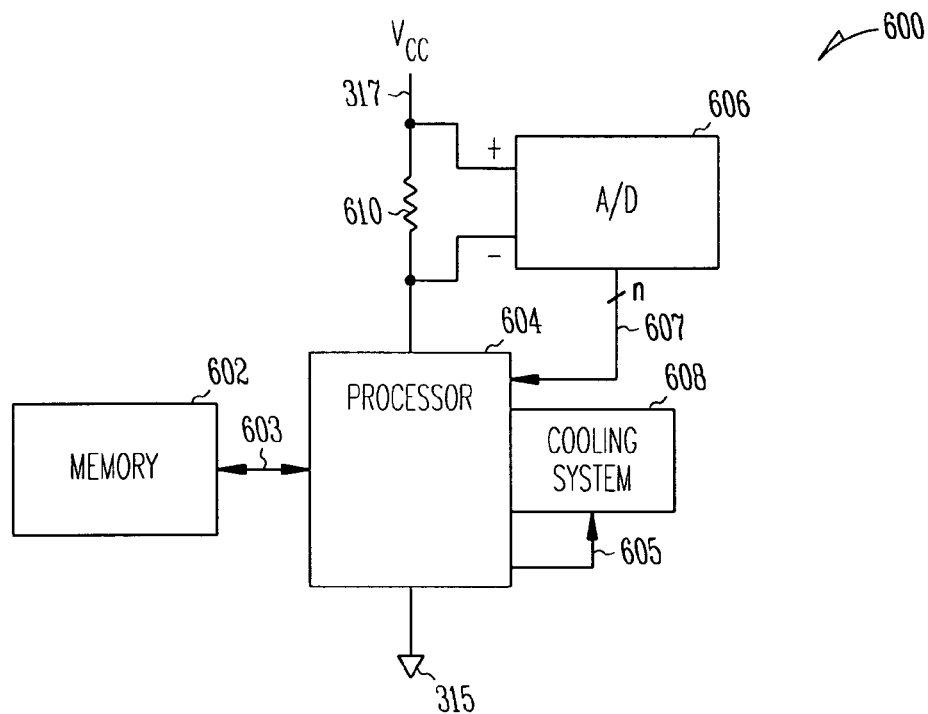
FIG. 6 shows a system to reduce leakage power consumption in a processor.

FIG. 6 shows a system to reduce leakage power consumption in a processor. System 600 includes processor 604, memory 602, cooling system 608, A/D 606, and resistor 610. The total power consumption of processor 604 is determined by the combination of resistor 610, A/D 606, and processor 604. This operation of determining total power consumption in system 600 is similar to system 300 (FIG. 3), except that the IC consuming the power and the IC performing the calculations are one and the same.

Processor 604 communicates with memory 602 on node 603, A/D 606 on node 607, and cooling system 608 on node 605. Each of these nodes can be separate as schematically shown in the figure, or can be part of a bus structure.

In operation, processor 604 receives the indication of total power consumption on node 607, and conditionally commands cooling system 608 to expend power in cooling processor 604. Processor 604 can utilize the total power consumption information alone to command cooling system 608 to expend power, or can utilize the total power consumption information in combination with other information to command cooling system 608 to expend power.

For example, in some embodiments, processor 604 compares total power consumption to a threshold power level, and commands cooling system 608 to turn on when the threshold is exceeded. In other embodiments, multiple thresholds exist, and processor 604 commands cooling system 608 to expend a variable amount of power as a function of the number of thresholds exceeded.

Also for example, in other embodiments, processor 604 maintains nominal expected power consumption information, and conditionally commands cooling system 608 to expend power as a function of both total power consumption and nominal expected power consumption. Further, in some embodiments, total energy consumption is computed, and cooling system 608 is commanded to expend power as a function of the total energy consumption.

Figure 7:
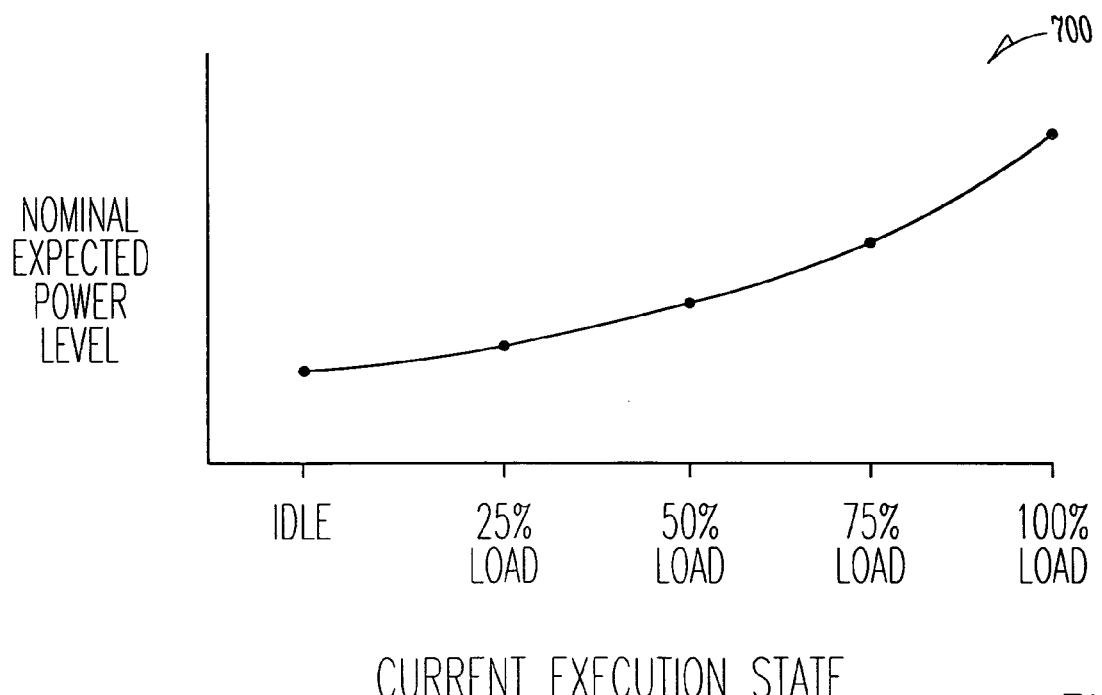
FIG. 7 shows a graph of characterization data for use in conjunction with the system of FIG. 6.

FIG. 7 shows a graph of characterization data for use in conjunction with the system of FIG. 6. Graph 700 shows nominal expected power as a function of the current execution state of the processor. The execution state of the processor can be any state information that affects the power consumption of the processor. For example, the execution state can be the frequency of operation, a software emulation mode, a protected mode of operation versus an application level mode of operation, or the like. For simplicity, graph 700 is shown with nominal expected power as a function of a single variable: percent software load. In some embodiments, other single variables are used as the dependent variable, and in other embodiments, multiple variables are used, resulting in a multi-dimensional graph. In general, any state information can be utilized in graph 700 without departing from the scope of the present invention.

The information presented in FIG. 7 is shown in graph form. In some embodiments, the information in graph 700 is maintained in table form in memory that is accessible to a processor. For example, referring now back to FIG. 6, the table can be maintained in memory 602. When processor 604 receives total power consumption information on node 607, processor 604 can retrieve nominal expected power information from memory 602, and estimate leakage power as the difference. Processor 604 can then conditionally command cooling system 608. In some embodiments, processor 604 commands cooling system 608 to turn on when the estimated leakage power exceeds a threshold. In other embodiments, processor 604 maintains multiple thresholds to which the estimated leakage power is compared, and then commands cooling system 608 to expend a variable amount of power as a function of the number of thresholds exceeded. In still other embodiments, processor 604 maintains data tables that represent the data shown in FIGS. 2, 4, and 6, and determines an appropriate amount of power to be expended in cooling system 608 based on an estimate of leakage power savings.

Figure 8:
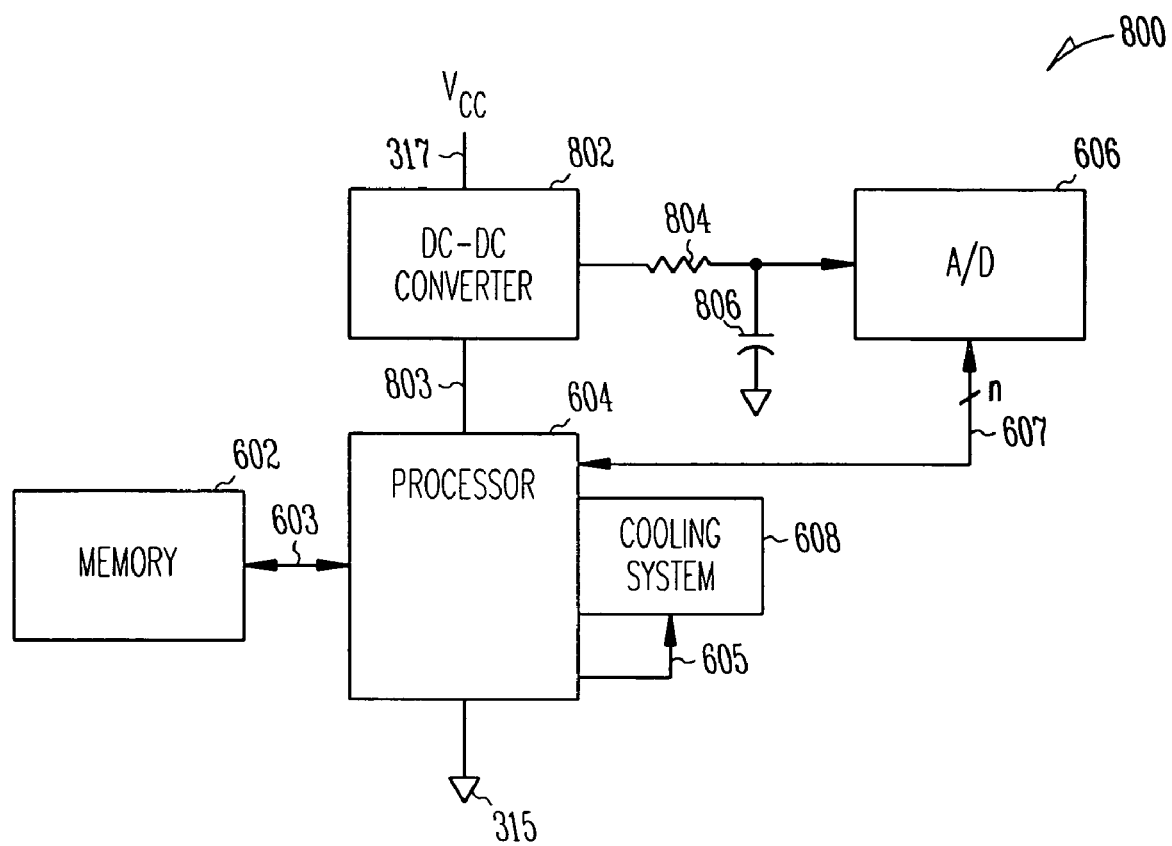
FIG. 8 shows another system to reduce leakage power consumption in a processor.

FIG. 8 shows another system to reduce leakage power consumption in a processor. System 800, like system 600 (FIG. 6), includes A/D 606, processor 604, memory 602, and cooling system 608. In contrast to system 600, system 800 includes DC-DC converter 802, resistor 804, and capacitor 806. DC-DC converter 802 converts a DC power supply voltage on node 317 (Vcc) to a different power supply voltage on node 803 to supply processor 604. DC-DC converter 802 also outputs a signal on node 805.

The signal on node 805 gives an indication of current output, or "current draw," from DC-DC converter 802 on node 803. In some embodiments, the signal on node 805 is a sawtooth waveform that is a result of a switching element within DC-DC converter 802. In other embodiments, the signal on node 805 is a pulse code modulated (PCM) signal that has a duty cycle that is proportional to current output on node 803. In general, any signal format that gives an indication of current output on node 803 can be utilized without departing from the scope of the present invention.

Resistor 804 and capacitor 806 form a low-pass filter that converts the signal on node 805 to a form suitable for input to A/D 606. A/D 606 digitizes the voltage value output from the low-pass filter, and the remaining portions of system 800 function in a similar fashion to system 600 (FIG. 6). Processor 604 receives from A/D 606 an indication of total power consumed in processor 604 and, as a function of total power consumption alone or total power consumption combined with nominal expected power consumption, commands cooling system 608 to expend power to cool processor 604.

Systems represented by the various foregoing figures can be of any type. Examples of represented systems include computers (e.g., desktops, laptops, handhelds, servers, Web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Figure 9:
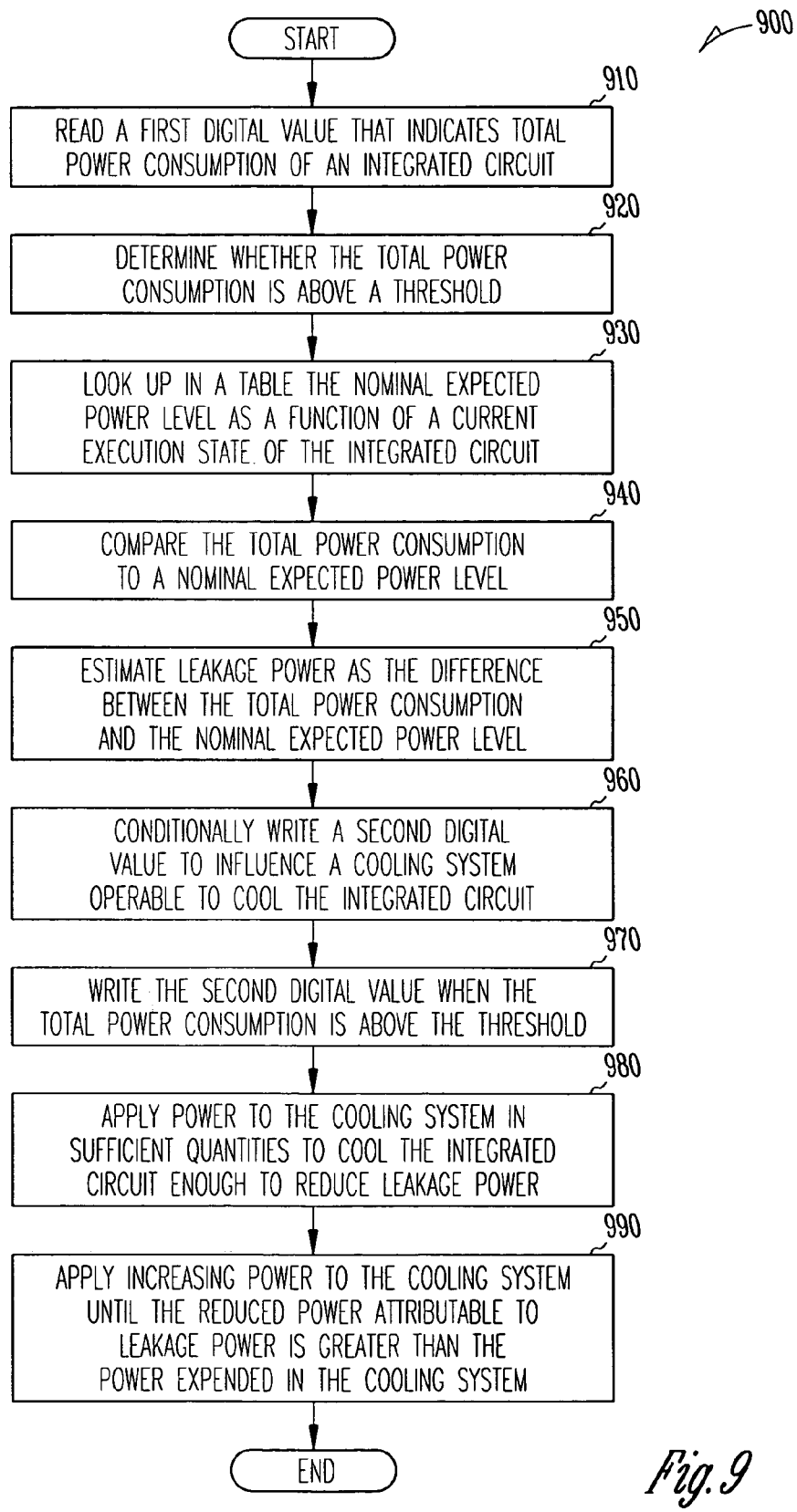
FIG. 9 shows a flowchart of a method for reducing leakage power consumption in an integrated circuit.

FIG. 9 shows a flowchart of a method for reducing leakage power consumption in an integrated circuit. Method 900 begins at 910 when a first digital value is read. The first digital value represents total power consumption in an integrated circuit. In some embodiments, 910 represents a processor such as processor 306 (FIGS. 3 and 5) reading a digital value from an A/D converter. This first digital value can represent total current as in FIGS. 3 and 5, or can represent actual power. When the first digital value represents total current, the processor can multiply the total current and the operating voltage of the integrated circuit to arrive at the total power.

As described above, in some embodiments, method 900 is performed by a processor. In some of these embodiments, the integrated circuit referenced in block 910 is separate from the processor. This corresponds to embodiments represented by FIGS. 3 and 5. In other embodiments, the integrated circuit referenced in block 910 is also the processor that performs the method. This corresponds to embodiments represented by FIGS. 6 and 8, in which processor 604 can perform method 900. In these embodiments, processor 604 reads a first digital value on node 607 that represents the total power consumed in processor 604. The remaining description of method 900 refers to all of the embodiments described herein, and is not limited by whether or not the measured power is consumed by the processor that performs the method.

At 920, a determination is made whether the total power consumption is above a threshold. In some embodiments, no further action is taken if the total power consumption is below the threshold. This can be useful in part because the potential power savings may be slight when the total power consumption is below the threshold.

At 930, a nominal expected power level is looked up in a table as a function of a current execution state of the integrated circuit. The current execution state can be any state information that affects nominal expected power. For example, in some embodiments, the current execution state includes the percent software load as shown in FIG. 7. In some embodiments, the current execution state includes information describing frequency of operation. Also in some embodiments, the current execution state can include information regarding environmental conditions such as ambient temperature and die temperature.

"Expected power" describes the amount of power expected to be consumed in an integrated circuit. Many integrated circuits have normal variations of expected power based on manufacturing variations. "Nominal expected power" describes a nominal value for expected power consumption given the normal variations found across large quantities of integrated circuits.

At 940, the total power consumption is compared against the nominal expected power level, and at 950, leakage power is estimated as the difference between the total power consumption and the nominal expected power level. This leakage power estimate can be utilized to determine whether power should be expended in a cooling device. In general, the processor performing method 900 also has access to information regarding how much power can be saved by cooling the integrated circuit, and how much power should be expended in a cooling system to cool the integrated circuit. Using all of the available information, the processor performing method 900 endeavors to effect an overall power savings.

In some embodiments of method 900, actions described with respect to blocks 930, 940 and 950 are not performed. In these embodiments, decisions to cool the integrated circuit are made as a function of total power (see block 920), and not as a function of estimated leakage power. In other embodiments, actions described with respect to block 920 are not performed. In these embodiments, decisions to cool the integrated circuit are made as a function of estimated leakage power and not as a function of total power. In still further embodiments, both total power and estimated leakage power are considered when making decisions regarding expending energy in a cooling system. Also, in some embodiments, total energy consumption is computed from the total power consumption over time, and decisions to cool the integrated circuit are made as a function of the total energy consumed.

At 960, a second digital value is conditionally written to influence a cooling system operable to cool the integrated circuit. For example, in one condition (total power below the threshold) the second digital value may not be written, thereby not influencing the cooling system. In other conditions (total power is above the threshold or leakage power is above a threshold), the second digital value may be written, thereby influencing the cooling system. The second digital value can be a single bit of information that turns on or off the cooling system, or can be a multi-bit word that turns on or off the cooling system to a varying degree. Referring now back to FIGS. 3 and 5, the second digital value is written to node 307 by processor 306. In embodiments represented by FIGS. 6 and 8, the second digital value is written to node 605 by processor 604.

At 970, the second digital value is written when the total power consumption is above a threshold. As stated above, in some embodiments, the second digital value is conditionally written only as a function of the total power level. In other embodiments, the second digital value is conditionally written as a function of total power level as well as a function of estimated leakage power. Block 970 describes all of these embodiments.

At 980, power is applied to the cooling system in quantities sufficient to cool the integrated circuit enough to reduce leakage power. As stated above, the processor performing method 900 can have access to information represented by graphs 200, 400, and 700, shown in FIGS. 2, 4, and 7, respectively. Method 900 contemplates combining the necessary information to ascertain the quantity of active cooling power useful to reduce leakage power.

At 990, power is increasingly applied to the cooling system until the reduced power attributable to leakage power is greater than the power expended in the cooling system. Utilizing information described in the previous paragraph, the processor performing method 900 can determine how much leakage power can be saved by cooling the integrated circuit. In addition, the processor can determine whether an overall power savings can be achieved, and the amount of power to be expended in the cooling system to achieve that result.

The actions of the various method embodiments of the present invention can be performed in any order without departing from the scope of the present invention. Further, in some embodiments, not all of the listed actions are performed. For example, in some embodiments actions described in blocks 920 and 970 are omitted, and in other embodiments, actions described in blocks 930, 940, and 950 are omitted.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of reducing leakage power in an integrated circuit comprising:
   measuring total power consumed by the integrated circuit;
   determining the leakage power from a nominal expected power and the total power; and
   expending energy to cool the integrated circuit and reduce leakage power if the cooling energy expended is less than the reduction in leakage power.

2. The method of claim 1 wherein expending energy comprises:
   comparing the leakage power to a threshold; and
   when the leakage power is above the threshold, applying power to an integrated circuit cooling system.

3. The method of claim 1 wherein the integrated circuit is a processor, and wherein expending energy comprises the processor writing to a port that is coupled to an integrated circuit cooling system.

4. The method of claim 3 wherein measuring total power comprises:
   receiving an analog signal from a DC-DC converter;
   converting the analog signal to a digital signal; and
   receiving the digital signal at the processor.

5. The method of claim 3 wherein measuring total power comprises:
   measuring current into the processor; and
   multiplying the current into the processor with the voltage across the processor.

6. The method of claim 3 wherein expending energy comprises the processor determining an amount of power necessary to cool the processor to reduce leakage power by a known amount, and applying the necessary amount of power to the integrated circuit cooling system.

7. The method of claim 1 wherein the method is performed in the order presented.

* * * * *